United States Patent
Kazumi et al.

(10) Patent No.: US 11,843,095 B2
(45) Date of Patent: Dec. 12, 2023

(54) SECONDARY BATTERY MANAGEMENT DEVICE, SECONDARY BATTERY MANAGEMENT METHOD, AND NON-TRANSITORY COMPUTER READABLE STORAGE MEDIUM

(71) Applicant: Yokogawa Electric Corporation, Musashino (JP)

(72) Inventors: Masahiro Kazumi, Tokyo (JP); Takeshi Matsushita, Tokyo (JP)

(73) Assignee: YOKOGAWA ELECTRIC CORPORATION, Musashino (JP)

( * ) Notice: Subject to any disclaimer, the term of this patent is extended or adjusted under 35 U.S.C. 154(b) by 260 days.

(21) Appl. No.: 17/124,867

(22) Filed: Dec. 17, 2020

(65) Prior Publication Data
US 2021/0194071 A1 Jun. 24, 2021

(30) Foreign Application Priority Data
Dec. 19, 2019 (JP) .................. 2019-229655

(51) Int. Cl.
*H01M 10/44* (2006.01)
*H02J 7/00* (2006.01)

(52) U.S. Cl.
CPC ........... *H01M 10/44* (2013.01); *H02J 7/0016* (2013.01); *H02J 7/00032* (2020.01); *H02J 7/0047* (2013.01)

(58) Field of Classification Search
CPC .... H01M 10/44; H02J 7/00032; H02J 7/0016; H02J 7/0047

USPC ......................................................... 320/134
See application file for complete search history.

(56) References Cited

U.S. PATENT DOCUMENTS

| | | | |
|---|---|---|---|
| 2011/0012604 A1* | 1/2011 | Tsujiko | H01M 4/5825 324/427 |
| 2013/0027047 A1 | 1/2013 | Yoshioka et al. | |
| 2015/0357852 A1 | 12/2015 | Nakao et al. | |
| 2016/0061901 A1 | 3/2016 | Kudo et al. | |
| 2017/0371000 A1 | 12/2017 | Fukushima et al. | |
| 2018/0074129 A1* | 3/2018 | Nakao | B60L 58/18 |
| 2019/0273293 A1 | 9/2019 | Kim et al. | |
| 2022/0029428 A1* | 1/2022 | Ino | B60L 50/60 |

FOREIGN PATENT DOCUMENTS

| CN | 110024208 A | 7/2019 |
|---|---|---|
| JP | 2009-252381 A | 10/2009 |

* cited by examiner

*Primary Examiner* — Nathaniel R Pelton
(74) *Attorney, Agent, or Firm* — WHDA, LLP (57) ABSTRACT

A secondary battery management device is communicably connected to a secondary battery unit including a secondary battery, and manages the secondary battery unit. The secondary battery management device is configured to: request the secondary battery unit to transmit a voltage and a state value of the secondary battery; receive the voltage and the state value of the secondary battery transmitted from the secondary battery unit; calculate a value of correction of the state value on the basis of the voltage and the state value which have been received; and transmit the calculated value of correction to the secondary battery unit in order to apply the calculated value of correction.

15 Claims, 4 Drawing Sheets

SECONDARY BATTERY MANAGEMENT DEVICE, SECONDARY BATTERY MANAGEMENT METHOD, AND NON-TRANSITORY COMPUTER READABLE STORAGE MEDIUM

BACKGROUND

Technical Fields

The present invention relates to a secondary battery management device, a secondary battery management method, and a non-transitory computer readable storage medium.

Priority is claimed on Japanese Patent Application No. 2019-229655, filed on Dec. 19, 2019, the contents of which are incorporated herein by reference.

Description of Related Art

In recent years, a system, which includes a secondary battery capable of being charged and discharged and charges and discharges the secondary battery when necessary, has been used in various fields. For example, in the field of electric power, the system is used to shift a part of daytime electric power consumption to nighttime electric power (a peak shift). In such a system, it is important to accurately detect information representing a state of the secondary battery so that the system is operated safely and efficiently for a long period. The information representing the state of the secondary battery is, for example, the remaining capacity or a charging rate (a state of charge, hereinafter also referred to as an "SOC") of the secondary battery or the like.

Incidentally, in many conventional systems, information representing a detected state of a secondary battery is managed independently inside a secondary battery unit. If a manufacturer of the secondary battery unit is different, information representing the state of the secondary battery and a charging and discharging control management method are different. Conventionally, because information representing the state of the secondary battery is managed internally as described above, there is a problem in accurately ascertaining the state of the secondary battery and appropriately controlling the charging and discharging of the secondary battery.

SUMMARY

A secondary battery management device may be communicably connected to a secondary battery unit including a secondary battery, and manages the secondary battery unit. The secondary battery management device may be configured to: request the secondary battery unit to transmit a voltage and a state value of the secondary battery; receive the voltage and the state value of the secondary battery transmitted from the secondary battery unit; calculate a value of correction of the state value on the basis of the voltage and the state value which have been received; and transmit the calculated value of correction to the secondary battery unit in order to apply the calculated value of correction.

Further features and aspects of the present disclosure will become apparent from the following detailed description of exemplary embodiments with reference to the attached drawings.

DETAILED DESCRIPTION OF THE EMBODIMENTS

The embodiments of the present invention will be now described herein with reference to illustrative preferred embodiments. Those skilled in the art will recognize that many alternative preferred embodiments can be accomplished using the teaching of the present invention and that the present invention is not limited to the preferred embodiments illustrated herein for explanatory purposes.

An aspect of the present invention is to provide a secondary battery management device, a secondary battery management method, and a non-transitory computer readable storage medium capable of externally managing information representing a state of a secondary battery.

Hereinafter, embodiments of a secondary battery management device, a secondary battery management method, and a non-transitory computer readable storage medium according to the present invention will be described with reference to the drawings.

Overview

A management device according to the embodiment of the present invention enables information representing a state of a secondary battery to be externally managed. Specifically, the management device can correct the information representing the state of the secondary battery according to control from outside of the secondary battery unit. That is, the management device can correct the information representing the state of the secondary battery at a planned timing. Also, the information representing the state of the secondary battery can be corrected according to a unified method without depending upon a technique of a manufacturer of a secondary battery unit.

It is important for a system equipped with a secondary battery capable of being charged and discharged to accurately detect the information representing the state of the secondary battery (hereinafter referred to as a "state value"). By accurately detecting the state value, the system can be operated safely and efficiently for a long period. The state value of the secondary battery is, for example, the remaining capacity, an SOC, the maximum capacity, a degree of deterioration (a state of health, hereinafter also referred to as an "SOH"), or the like of the secondary battery.

For example, as one of methods of calculating the remaining capacity, there is a method using an integrated value of electric current. In this method, the remaining capacity is calculated by integrating electric currents of charging and discharging to acquire an integrated value and adding an integrated value to the initial remaining capacity. When the secondary battery unit is used for a long period, a measurement error of the electric current value is accumulated, and an error occurs between the calculated remaining capacity and the actual remaining capacity. In order to correct the error, the remaining capacity is corrected. However, the management of the state value such as correction is performed independently inside the secondary battery unit. Thus, the state value may be corrected at a timing which is not intended by the user and charging and discharging control may not be performed as planned.

Also, there may be efforts to make a function of a virtual power plant by utilizing distributed power sources such as virtual power plants. This system includes secondary battery units from several different manufacturers. A state value correction algorithm and a correction timing differ in accordance with a manufacturer or type of the secondary battery unit. Thus, it may be difficult to manage state values of a plurality of secondary battery units according to a unified method.

A concept of the state value of the secondary battery also differs in accordance with the manufacturer or type of the secondary battery unit. For example, an SOC value at the time of full charging may differ between a plurality of secondary battery units. Thus, it may be difficult to utilize state values of a plurality of secondary battery units according to a unified concept.

Also, if an attempt is made to detect a state value with high accuracy by performing an advanced calculation process inside each secondary battery unit, it is necessary to provide a high-performance processor in the secondary battery unit. However, the cost of the system is increased by mounting a high-performance processor inside each secondary battery unit.

Therefore, the secondary battery management device of the present embodiment is connected to a secondary battery unit including a secondary battery so that communication with the secondary battery unit is possible and externally manages the secondary battery unit. The management device requests the secondary battery unit to transmit a voltage and a state value of the secondary battery and receives the voltage and state value of the secondary battery transmitted from the secondary battery unit. The management device calculates a value of correction of the state value on the basis of the voltage and the state value that have been received and transmits the calculated value of correction to the secondary battery unit so that the calculated value of correction is applied. Thereby, information representing the state of the secondary battery can be externally managed.

First Embodiment

<Configuration of Secondary Battery Management System>

Figure 1:
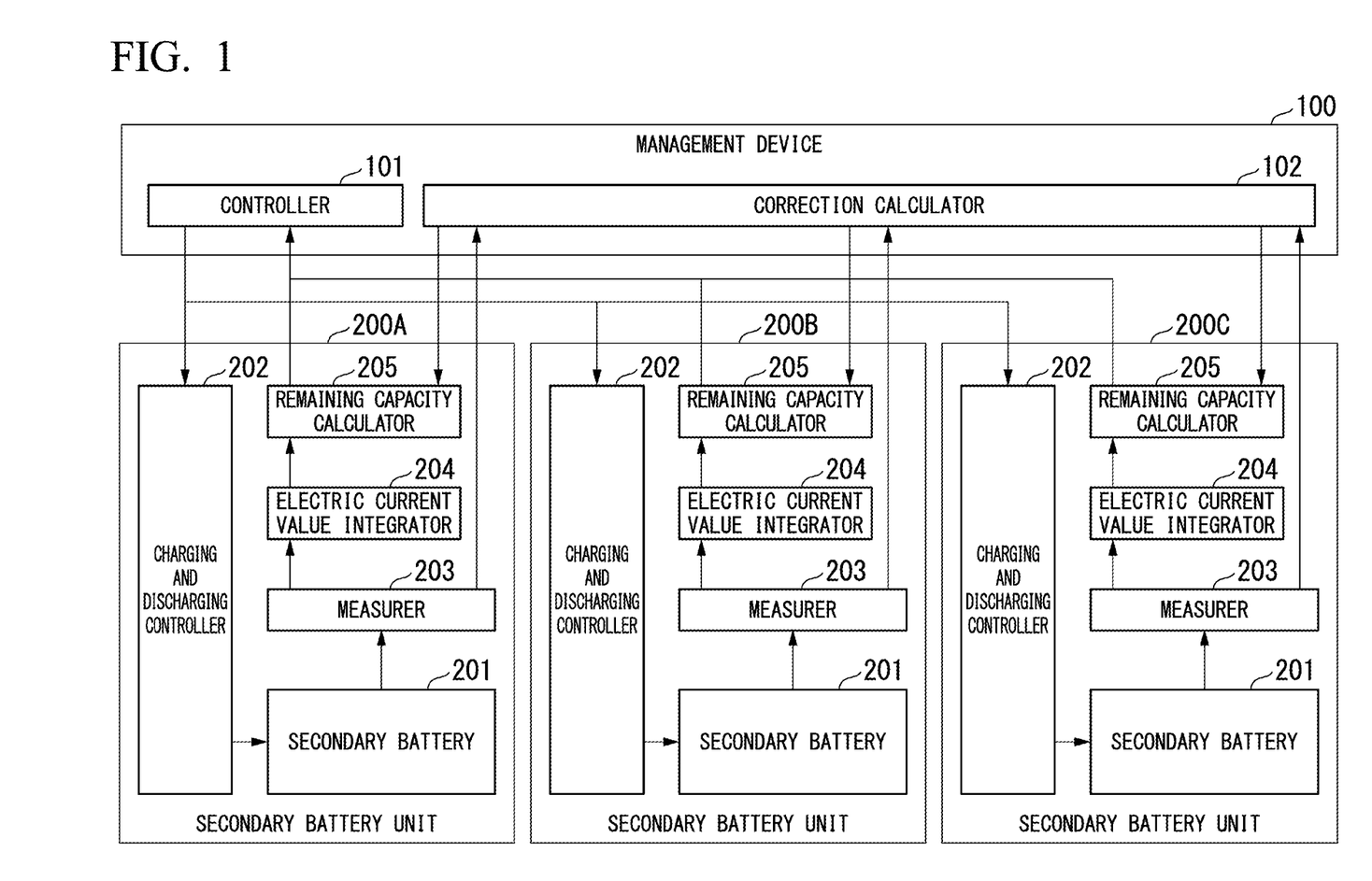
FIG. 1 is a block diagram showing a configuration of a secondary battery management system according to a first embodiment.

An example of a configuration of a secondary battery management system according to an embodiment of the present invention will be described. FIG. 1 is a block diagram showing a configuration of a secondary battery management system according to a first embodiment. The secondary battery management system shown in FIG. 1 includes a management device 100 and a plurality of secondary battery units 200A to 200C. Users of the secondary battery management system are, for example, an electric power provider, an information service provider, a facility manager, an aggregator, and the like.

The plurality of secondary battery units 200A to 200C shown in FIG. 1 may be secondary battery units 200 made by different manufacturers. Although an example in which the secondary battery management system includes the plurality of secondary battery units 200A to 200C is shown in the example of FIG. 1, the number of secondary battery units 200 may be one. Hereinafter, when the plurality of secondary battery units 200A to 200C are not distinguished, they are referred to as secondary battery units 200.

The management device 100 and each secondary battery unit 200 are connected via a network. The management device 100 controls the charging and discharging of each secondary battery unit 200 and manages a state value of each secondary battery 201. Also, the management device 100 may be a server in a cloud environment.

The management device 100 includes a controller 101 and a correction calculator 102. The controller 101 controls charging and discharging of each secondary battery unit 200. The controller 101 outputs a charging and discharging control instruction to each secondary battery unit 200 according to a charging and discharging plan. The correction calculator 102 requests the secondary battery unit 200 to transmit data used for calculating the value of correction of the state value and calculates the value of correction on the basis of the data that has been received. The correction calculator 102 causes the calculated value of correction to be applied to the secondary battery unit 200 at a timing designated for the secondary battery unit 200.

The state value in the present embodiment represents, for example, the remaining capacity, an SOC, the maximum capacity, an SOH, or the like of the secondary battery. The remaining capacity (Ah) is the remaining value of electricity with which the secondary battery can be discharged at a current point in time. The maximum capacity (Ah) is the maximum value of electricity that can be stored in a secondary battery within a specified voltage range. The SOC (%) represents a charging rate of the secondary battery and is calculated according to the formula "remaining capacity maximum capacity×100." The SOH (%) represents the degree of deterioration of the secondary battery and is calculated by the formula "maximum capacity at current point in time=initial maximum capacity×100." Also, in the present embodiment, an example in which the remaining capacity is corrected as a state value is shown.

The secondary battery unit 200 includes a secondary battery 201, a charging and discharging controller 202, a measurer 203, an electric current value integrator 204, and a remaining capacity calculator 205. Here, the configuration of one secondary battery unit 200 will be described, but the same applies to the configuration of the other secondary battery unit 200.

The secondary battery 201 is a lithium ion battery, a nickel hydrogen battery, or the like. The charging and discharging controller 202 controls charging and discharging states of the secondary battery 201 according to an instruction output from the controller 101 of the management device 100. The measurer 203 measures an electric current value and a voltage value of the secondary battery 201 at predetermined intervals. The measurer 203 includes, for example, a voltage sensor, an electric current sensor, and the like. The measurer 203 outputs the electric current value and the voltage value that have been measured to the electric current value integrator 204 and the correction calculator 102.

The electric current value integrator 204 integrates electric current values measured by the measurer 203 according to a Coulomb counting process and calculates the integrated value of the electric current values for a predetermined period. The electric current value integrator 204 performs a subtraction operation on the integrated value at the time of discharging and performs an addition operation on the integrated value at the time of charging. That is, the electric current value integrator 204 integrates an electric current flowing into the secondary battery 201 and an electric current flowing out from the secondary battery 201 to calculate an integrated value for a predetermined period.

The remaining capacity calculator 205 updates the remaining capacity by adding the remaining capacity to the integrated value. In response to a request from the management device 100, the remaining capacity calculator 205 outputs measured values obtained by measuring the voltage value and the electric current value and the remaining capacity calculated by the electric current value integrator 204 to the management device 100. Also, when the value of correction of the remaining capacity is received from the management device 100, the remaining capacity calculator 205 updates the remaining capacity according to the value of correction.

Figure 2:
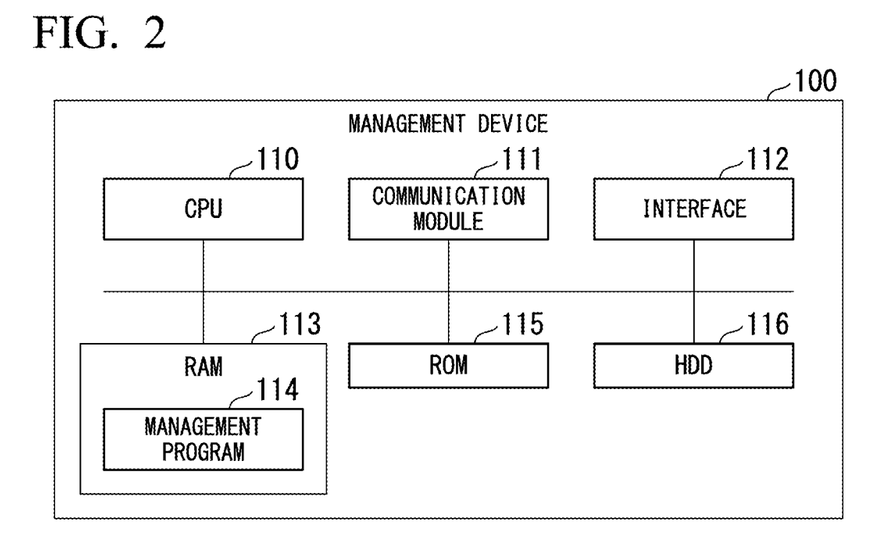
FIG. 2 is a diagram showing an example of a hardware configuration of a management device shown in FIG. 1.

FIG. 2 is a diagram showing an example of a hardware configuration of the management device 100 shown in FIG. 1. The management device 100 is a computer including a central processing unit (CPU) 110, a communication module 111, an interface 112, and the like. The management device 100 further includes a random access memory (RAM) 113, a read only memory (ROM) 115, a hard disk drive (HDD) 116, and the like.

The RAM 113 stores a management program 114. The CPU 110 reads and executes the management program 114 stored in the RAM 113 or the like. Thereby, the management device 100 implements the functions of the controller 101 and the correction calculator 102. Some of these functions of the controller 101 and the correction calculator 102 may be implemented by an electronic circuit.

The communication module 111 is connected to each secondary battery unit 200. The communication module 111 may perform wireless communication with each secondary battery unit 200 or may perform wired communication with each secondary battery unit 200. Also, the management device 100 may be connected to a terminal device (not shown) via the communication module 111. For example, by operating the terminal device, the user causes the terminal device to display the value of correction calculated by the management device 100 or the remaining capacity after the correction.

Here, a general state value correction method will be described with reference to FIG. 3. A method of calculating the value of correction in the present embodiment is not limited to the example of FIG. 3. There are various generally known methods of correcting the state value.

<Remaining Capacity Correction Method>

Figure 3:
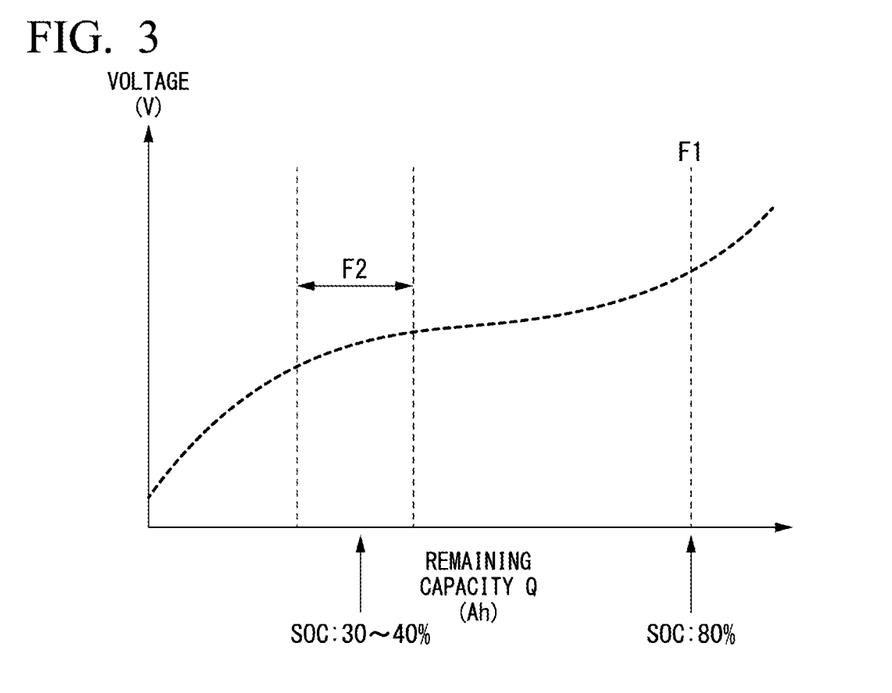
FIG. 3 is a diagram showing an example of charging characteristics of a secondary battery.

FIG. 3 is a diagram showing an example of charging characteristics of the secondary battery. The horizontal axis of FIG. 3 represents the remaining capacity (Ah) and the vertical axis represents a voltage value (V). FIG. 3 shows the transition of the voltage value when the secondary battery is charged while a constant current is flowing. A voltage of the secondary battery changes with a change in the remaining capacity of the secondary battery. In the example of FIG. 3, an SOC of "0%" is shown when the voltage value is the minimum and an SOC of "100%" is shown when the voltage value is the maximum.

As shown in FIG. 3, the relationship between the voltage of the secondary battery and the remaining capacity has predetermined characteristics. For example, as a characteristic, a distinctive feature appears in a relationship in a certain SOC section. An SOC value or an SOC section in which a distinctive feature appears is referred to as a feature point F1 or a feature section F2. The feature point F1 and the feature section F2 differ according to, for example, characteristics of the secondary battery. The value of correction of the remaining capacity can be calculated using the feature point or the feature section.

For example, an example of a method of calculating the value of correction when the feature point F1 has an SOC of "80%" will be shown. The voltage value and the remaining capacity measured when the secondary battery 201 has an SOC of "80%" are acquired. On the basis of characteristics shown in FIG. 3 stored in advance, the remaining capacity corresponding to the measured voltage value is acquired. A difference between the remaining capacity acquired on the basis of the characteristics (FIG. 3) and the remaining capacity when the secondary battery 201 has an SOC of "80%" is acquired as a value of correction.

Characteristics of a relationship between the remaining capacity and the voltage differ according to a manufacturer or type of the secondary battery. Thus, the feature point F1 is not limited to the example of FIG. 3. The feature point F1 may have an SOC of "100%" or another value. For example, when the SOC is "100%," the SOC in the fully charged state is corrected to a value of "100%" by fully charging the secondary battery. However, in this case, the quality of the secondary battery tends to deteriorate by fully charging the secondary battery.

Also, an example of a method of calculating the value of correction when the feature section F2 has an SOC of "30% to 40%" will be shown. The voltage value and the remaining capacity measured when the secondary battery 201 has an SOC of "30% to 40%" are acquired. On the basis of the characteristics (FIG. 3) stored in advance, the remaining capacity corresponding to each measured voltage value is acquired. A difference between the remaining capacity acquired on the basis of the characteristics (FIG. 3) and the remaining capacity when the secondary battery 201 has an SOC of "30% to 40%" is acquired as a value of correction.

As described above, the calculation of the value of correction of the remaining capacity is not limited to this example. For example, in addition to the voltage value and the remaining capacity, the value of correction of the remaining capacity may be further calculated on the basis of a temperature, a resistance value, or the like. The value of correction can be further obtained with higher accuracy on the basis of a temperature, a resistance value, and the like.

There is also a method of calculating the value of correction with high accuracy using complicated calculation processing. Such a method includes a method of obtaining an open current voltage (OCV) from which a change in voltage during charging and discharging is excluded and a method of using differential characteristics. The differential characteristic "dV/dQ" represents a ratio of a change value "dV" of the voltage value of the secondary battery to a change value "dQ" of the remaining capacity. Using a relationship between the differential characteristic "dV/dQ" and the remaining capacity, the value of correction can be obtained with higher accuracy.

<Flow of Correction Calculation Process>

Figure 4:
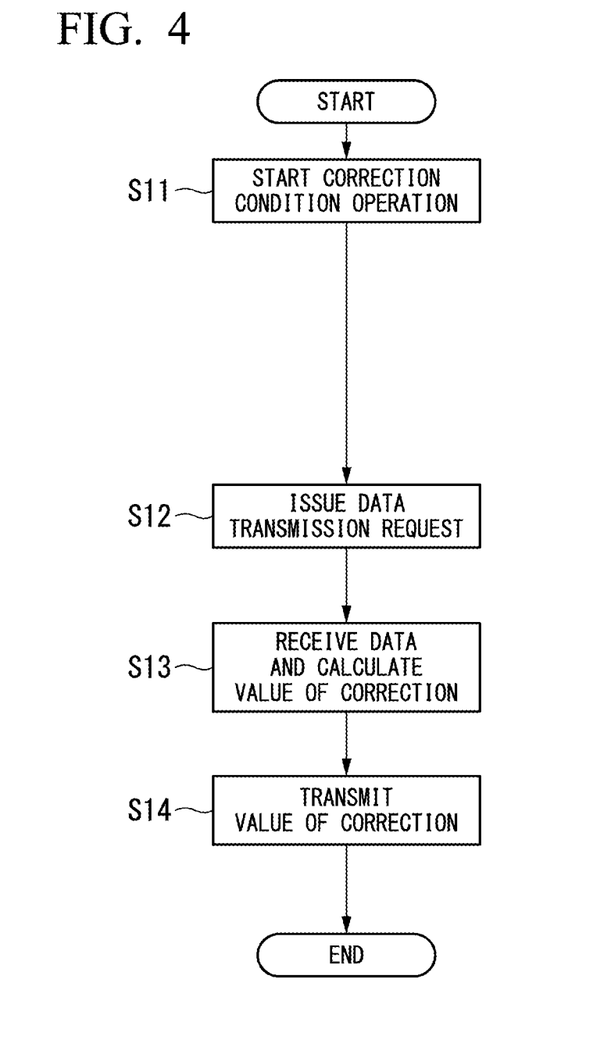
FIG. 4 is a flowchart showing an example of a process of the management device according to the present embodiment.
Figure 5:
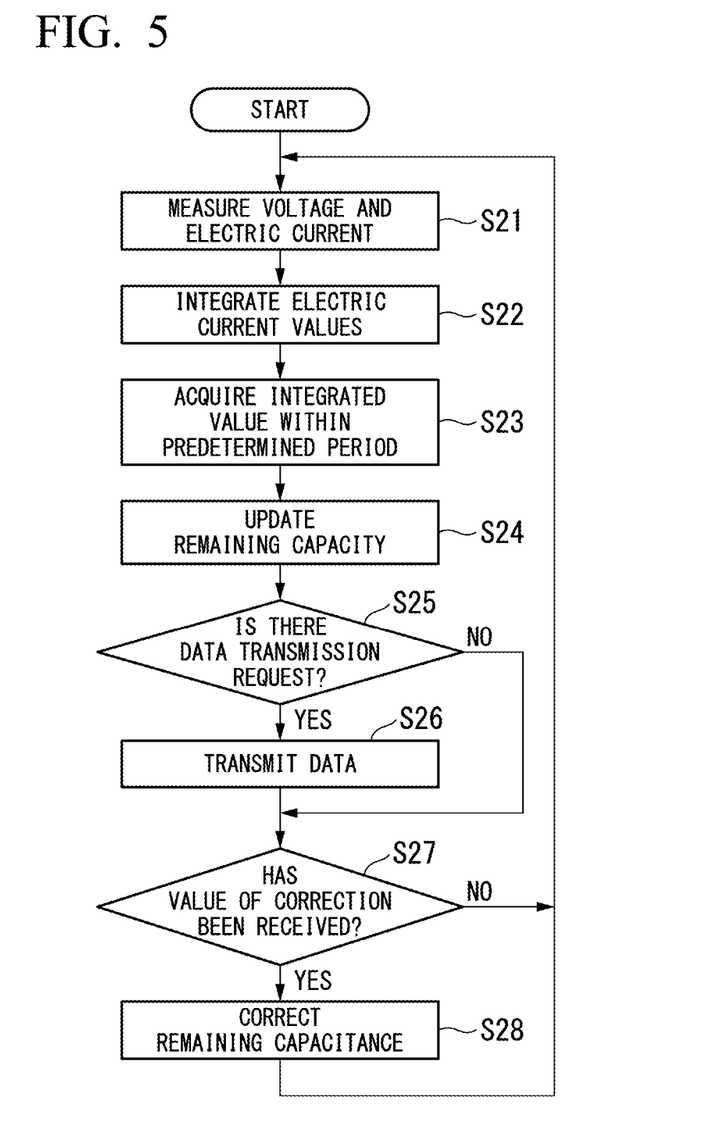
FIG. 5 is a flowchart showing an example of a process of a secondary battery unit according to the present embodiment.

FIG. 4 is a flowchart showing an example of a process of the management device 100 according to the present embodiment. FIG. 5 is a flowchart showing an example of a process of each secondary battery unit 200 according to the present embodiment. As described above, in the present embodiment, an example in which the remaining capacity is corrected will be shown.

First, a flow of a process of the management device 100 will be described according to the flowchart of FIG. 4. The controller 101 of the management device 100 starts an operation of a correction condition with respect to the secondary battery unit 200 (step S11). Specifically, the controller 101 controls charging and discharging of the secondary battery unit 200 so that the secondary battery has an SOC of the feature point F1 or the feature section F2 described with reference to FIG. 3. In this example, the controller 101 controls the charging and discharging of the secondary battery unit 200 so that at least one of charging and discharging is performed at an SOC of "30% to 40%."

More specifically, for example, when the SOC at a current point in time is "20%," the controller 101 sets an electric current flowing through the secondary battery 201 to a constant current and causes the secondary battery 201 to be charged until the SOC becomes "40%." On the other hand, for example, when the current SOC is "40%," the controller 101 causes the secondary battery 201 to be discharged until the SOC becomes "30%."

When the secondary battery 201 satisfies the correction condition, the correction calculator 102 of the management device 100 outputs a data transmission request to the secondary battery unit 200 (step S12). Data is measured values obtained by measuring the voltage value and the electric current value and the remaining capacity in a state in which the SOC of the secondary battery 201 is included in the feature section F2. That is, the correction calculator 102 requests the secondary battery unit 200 to transmit the measured values obtained by measuring the voltage value and the electric current value and the remaining capacity at predetermined time intervals in the state of an SOC of "30% to 40%." The correction calculator 102 receives the data from the secondary battery unit 200 and stores the data in a memory such as the RAM 113 or the HDD 116. The correction calculator 102 may receive the data from the secondary battery unit 200 at predetermined time intervals or may collectively receive the data.

The correction calculator 102 calculates the value of correction of the remaining capacity on the basis of the data received from the secondary battery unit 200 (step S13). The correction calculator 102 calculates the value of correction according to a predetermined algorithm. Also, an algorithm for calculating the value of correction may be designated in advance from a plurality of algorithms.

For example, the correction calculator 102 obtains the remaining capacity corresponding to the measured value of the voltage value in the state of an SOC of "30% to 40%" on the basis of the characteristics (FIG. 3) of the secondary battery 201 stored in advance. The correction calculator 102 obtains a difference between the obtained remaining capacity and the remaining capacity received from the secondary battery unit 200 as the value of correction. Also, in the present embodiment, the correction calculator 102 acquires an electric current value to verify whether or not charging and discharging are to be controlled in a state in which a constant current is flowing through the secondary battery 201.

As described above, the management device 100 outside of the secondary battery unit 200 calculates the value of correction of the remaining capacity. Also, when a plurality of secondary battery units 200 are provided, the management device 100 calculates the value of correction using an algorithm common to the plurality of secondary battery units 200. Thereby, the state value of the secondary battery can be corrected according to a unified method without depending upon a technique of the manufacturer of the secondary battery unit 200.

The correction calculator 102 outputs a calculated value of correction "ΔQc" to the secondary battery unit 200 at a timing designated for the secondary battery unit 200 (step S14). Thereby, the remaining capacity "Q" of the secondary battery unit 200 is corrected. Information such as a date and time designated as the timing is stored in a memory such as the RAM 113 or the HDD 116. The CPU 110 performs control for causing the value of correction to be applied to the secondary battery unit 200 at a designated timing according to the management program 114.

The timing of step S14 is, for example, a point in time when the user has issued a correction instruction via the management device 100. Alternatively, the timing may be a predetermined date and time designated in advance or a periodic date and time designated in advance. As described above, the remaining capacity is applied at the timing designated in advance. Thus, it is possible to restrict the occurrence of a situation in which the remaining capacity is corrected at a timing that is not intended by the user and therefore charging and discharging control cannot be performed as planned.

Also, when a plurality of secondary battery units 200 are provided, the management device 100 causes the value of correction to be applied at a timing designated for each of the plurality of secondary battery units 200. In this case, timing information such as a date and time is stored in the memory with respect to each of the plurality of secondary battery units 200. The CPU 110 performs control for causing the value of correction corresponding to each secondary battery unit 200 to be applied at a timing designated for each secondary battery unit 200 according to the management program 114. Thereby, the management device 100 can correct the remaining capacity at a timing suitable for each secondary battery unit 200.

Also, the management device 100 performs the processing of steps S11 to S13 at the designated timing. For example, the management device 100 may perform the processing of steps S11 to S13 immediately before the designated timing. Alternatively, the management device 100 may perform the processing of steps S11 to S13 in advance on the day before the designated timing or the like.

For example, the CPU 110 reads in advance information about a timing at which the value of correction of the secondary battery unit 200 will be applied from the memory to acquire the information. The CPU 110 sets a processing period for executing the processing of steps S11 to S13 according to the acquired information about the timing and controls the execution of the process. Also, a processing period such as a designated period immediately before the timing may be further designated in addition to the timing. Thereby, the remaining capacity can be externally managed more flexibly.

Also, the processing of steps S11 and S12 and the processing of step S13 may be executed in different periods. That is, the correction calculator 102 may execute a correction condition operation instruction, a data acquisition process, and a value-of-correction calculation process in different periods. For example, the correction calculator 102 may acquire data in advance and calculate the value of correction immediately before the timing at which the value of correction is applied.

Next, a flow of a process of the secondary battery unit 200 will be described according to the flowchart of FIG. 5. Although not shown in the flowchart, the secondary battery unit 200 receives a correction condition operation instruction from the management device 100. The secondary battery unit 200 iterates the processing of steps S21 to S24 shown below while charging and discharging are being controlled in accordance with the correction condition operation instruction.

The measurer 203 of the secondary battery unit 200 measures a voltage value and an electric current value of the secondary battery 201 (step S21). The electric current value integrator 204 of the secondary battery unit 200 integrates measured values obtained by measuring electric current values for a predetermined period (step S22). The electric current value integrator 204 obtains an integrated value "ΔQ" obtained by integrating the electric current values for the predetermined period (step S23). The remaining capacity calculator 205 of the secondary battery unit 200 adds the integrated value "ΔQ" obtained by integrating the electric current values for the predetermined period to the remaining capacity "Q" that has been retained to update the remaining capacity (step S24).

The remaining capacity calculator 205 determines whether or not a data transmission request has been received from the management device 100 (step S25). When the data transmission request has been received (YES in S25), the remaining capacity calculator 205 transmits continuous time-series data in a state in which the correction condition has been satisfied to the management device 100 (step S26). That is, the remaining capacity calculator 205 outputs the measured values (S21) obtained by measuring the voltage value and the electric current value at the time of an SOC of "30% to 40%" and the remaining capacity (S24) to the management device 100.

The remaining capacity calculator 205 determines whether or not the value of correction "ΔQc" has been received from the management device 100 (step S27). When the value of correction "ΔQc" has been received (YES in S27), the remaining capacity calculator 205 corrects the remaining capacity according to the received value of correction "ΔQc" (step S28). That is, the remaining capacity calculator 205 updates the remaining capacity by adding the received value of correction "ΔQc" to the latest remaining capacity "Q" updated in step S24.

After the remaining capacity correction process (step S28), or when the value of correction has not been received (NO in S27), the remaining capacity calculator 205 returns to the processing of step S21.

As described above, the secondary battery unit 200 iterates a process of detecting the remaining capacity through an integration process while periodically measuring the voltage value and the electric current value. During the process, when the correction condition operation instruction is received from the management device 100, the secondary battery unit 200 controls the SOC in the state of the feature point or the feature section. The secondary battery unit 200 outputs data for calculating the value of correction in the feature point or the feature section of the SOC to the management device 100. When the secondary battery unit 200 receives the value of correction from the management device 100 at a timing designated for the secondary battery unit 200, the secondary battery unit 200 updates the remaining capacity on the basis of the value of correction.

Although an example in which the value of correction of the remaining capacity is calculated has been described in the above-described embodiment, the same applies to a case in which the value of correction of the SOC is calculated. The management device 100 may calculate a difference value of the SOC as a value of correction in step S13. Alternatively, the SOC may be corrected on the basis of the corrected remaining capacity.

Also, in the above-described embodiment, an example in which the management device 100 receives the voltage value, the electric current value, and the remaining capacity from the secondary battery unit 200 has been described. However, the present invention is not limited to this example and the management device 100 may receive only the voltage value and the remaining capacity. Alternatively, the management device 100 may receive other data such as a temperature and a resistance value from the secondary battery unit 200 in addition to the voltage value and the remaining capacity.

Also, the feature point F1 or the feature section F2 used for calculating the value of correction may differ in accordance with the secondary battery unit 200. As described above, if a manufacturers or type of the secondary battery unit 200 is different, characteristics of the secondary battery 201 are also different. Therefore, the feature point F1 or the feature section F2 is set for each secondary battery 201 in accordance with the characteristics of the secondary battery 201. Also, the feature point F1 or the feature section F2 of each secondary battery unit 200 may be managed by the user via the management device 100.

Modified Examples

In the above-described embodiment, an example in which the remaining capacity or the SOC is corrected has been described. The present embodiment is not limited to this example and the present embodiment is also applicable to the correction of the maximum capacity and the SOH. As in the calculation of the value of correction of the remaining capacity, the maximum capacity and the value of correction of the SOH can be calculated on the basis of the voltage value and the remaining capacity. There are various methods for calculating the maximum capacity and the value of correction of the SOH, which are generally known technologies.

For example, the management device 100 requests the secondary battery unit 200 to transmit a voltage value and the remaining capacity at a characteristic point or a feature section of the SOC. The management device 100 calculates the value of correction of the maximum capacity on the basis of the voltage value and the remaining capacity received from the secondary battery unit 200. The management device 100 transmits the value of correction of the maximum capacity to the secondary battery unit 200 at the timing designated by the secondary battery unit 200 and causes the value of correction to be applied. Also, the management device 100 may calculate a difference value of the SOH as the value of correction. Alternatively, the SOH may be corrected on the basis of the corrected maximum capacity.

As described above, the management device 100 according to the present embodiment is connected to the secondary battery unit 200 including the secondary battery 201 so that communication with the secondary battery unit 200 is possible and manages the secondary battery unit 200. The management device 100 requests the secondary battery unit 200 to transmit a voltage and a state value of the secondary battery, and receives the voltage and the state value of the secondary battery 201 transmitted from the secondary battery unit 200. The management device 100 calculates the value of correction of the state value on the basis of the received voltage and the state value and transmits the value of correction to the secondary battery unit 200 so that the calculated value of correction is applied.

Thereby, the management device 100 can issue an instruction for correcting the state value of the secondary battery 201 from outside of the secondary battery unit 200. That is, a timing of correction of the state value of the secondary battery 201 can be controlled from outside of the secondary battery unit 200. Thereby, the state value of the secondary battery 201 can be corrected at a timing intended by the user.

Therefore, it is possible to restrict the occurrence of a situation in which the state value of the secondary battery 201 is corrected at a timing that is not intended by the user and charging and discharging control cannot be performed as planned. In other words, charging and discharging control can be performed as planned by correcting the state value of the secondary battery 201 at a planned timing.

Also, in the present embodiment, the management device 100 outside of the secondary battery unit 200 calculates the value of correction of the state value according to a shared algorithm. Thus, when the secondary battery management system includes a plurality of secondary battery units 200, the following effects are obtained. That is, the state value can be corrected according to a common algorithm that does not depend on the manufacturer's technique and the algorithm for use in calculation of the value of correction can be recognized. Also, the concept of the state value can be unified regardless of the manufacturer of the secondary battery unit 200. As described above, the state value of the secondary battery 201 can be managed according to a unified algorithm or concept.

Also, as the management device 100 according to the present embodiment, the management device 100 outside the secondary battery unit 200 has a function of calculating the value of correction of the state value. Thereby, it is not necessary to provide a processor having an advanced calculation function inside each secondary battery unit 200. Thus, the cost of the secondary battery unit 200 can be reduced.

Second Embodiment

Although not shown in FIG. 1, a secondary battery unit 200 includes a group of cells in which a plurality of single battery cells of the secondary battery 201 are connected in series. When the remaining capacities do not match between the plurality of cells, the remaining capacity of the secondary battery 201 is limited to the remaining capacity of the cell having the smallest remaining capacity. Therefore, discharging control (a cell balance function) between cells is performed to equalize the remaining capacities of cells.

Here, an example of control of the cell balance function will be described. For example, in the control of the cell balance function, when a specific cell among a plurality of cells reaches the maximum voltage (a fully charged state), the charging of the cell is stopped and the cell is discharged. Also, for example, a charging instruction is issued with respect to other cells that have not been fully charged. By iterating charging and discharging for the cells connected in series, the plurality of cells is fully charged with respect to the remaining capacity.

According to this example, a period in which the secondary battery 201 cannot be used occurs by iterating charging and discharging for the number of cells connected in series. Therefore, it is desirable to implement cell balance without fully charging each cell. However, when an algorithm for analyzing the balance of the remaining capacity among a plurality of cells is implemented inside each secondary battery unit 200, the cost increases.

Therefore, in the management device 100 according to the second embodiment, the management device 100 outside the secondary battery unit 200 implements the cell balance function. That is, the remaining capacity of each cell of the secondary battery unit 200 is detected and discharging control is performed for each cell. The configuration example of the system and the hardware configuration of the management device 100 are similar to those in the first embodiment. The flowchart of the process of the management device 100 and the secondary battery unit 200 is similar to that of the first embodiment except for the following processing.

The management device 100 according to the second embodiment requires the secondary battery unit 200 to transmit a voltage and the remaining capacity of each of the plurality of cells. The management device 100 calculates a value of correction of the remaining capacity of each cell on the basis of the voltage and the remaining capacity of each cell that have been received. The management device 100 transmits the calculated value of correction of each cell to the secondary battery unit 200 and issues a discharging control instruction for each cell on the basis of the remaining capacity after the correction of each cell.

The management device 100 compares the remaining capacities between a plurality of cells and controls discharging times of some cells having the remaining capacities which are relatively high. That is, the management device 100 causes a cell having the remaining capacity which is relatively high to be discharged. Thereby, the remaining capacities of a plurality of cells can be equalized without fully charging each cell. Also, it is possible to restrict the occurrence of a period that cannot be used for the execution of the cell balance. In this manner, the management device 100 can manage the remaining capacity of each cell of the secondary battery unit 200 and manage the discharging of each cell.

Although an example in which the value of correction of the remaining capacity of each of the plurality of cells is calculated has been described in the second embodiment, the present invention is effective even if the value of correction of the SOC is calculated as in the first embodiment. The management device 100 may also calculate the difference value of the SOC as the value of correction of the state value of each cell. Alternatively, the SOC may be acquired on the basis of the corrected remaining capacity. Also, as in the first embodiment, the present invention is effective even if the maximum capacity and the value of correction of the SOH of each of the plurality of cells are calculated.

As described above with reference to FIG. 2, the management device 100 may be implemented by a computer. In this case, a program for implementing each function is recorded on a computer-readable recording medium. Each function may be implemented by causing a computer system to read the program recorded on the recording medium and execute the program using a calculation processing circuit such as a CPU.

Also, it is assumed that the "computer system" described here is a computer system embedded in each device and includes an operating system (OS) and hardware such as peripheral devices. Also, the "computer-readable recording medium" refers to a storage device including a flexible disk, a magneto-optical disc, a ROM, a portable medium such as a CD-ROM, a hard disk embedded in the computer system, and the like.

The "computer-readable recording medium" may include a computer-readable recording medium for dynamically retaining a program for a short time period as in a communication line when the program is transmitted via a network such as the Internet or a communication circuit such as a telephone circuit. Also, the "computer-readable recording medium" may include a computer-readable recording medium for retaining the program for a certain time period as in a volatile memory inside the computer system including a server and a client when the program is transmitted.

The above-described program may be used to implement some of the above-described functions. Also, the program may implement the above-described functions in combination with a program already recorded on the computer system. Also, the above-described computer system may be configured as a computing resource which is a component of a cloud computing system. The cloud computing system makes it possible to mutually transmit and receive various types of data via a network.

Also, a part of all of each of the devices may be implemented as an integrated circuit such as a large scale integration (LSI) circuit. Functional blocks of each device may be made into a processor individually or a part or all thereof may be integrated into a processor. Also, a technique of forming an integrated circuit is not limited to an LSI circuit and this may be implemented by a dedicated circuit and/or a general-purpose processor. Also, if technology for an integrated circuit which replaces an LSI circuit emerges with the advancement of semiconductor technology, an integrated circuit based on this technology may be used.

[Supplementary Note]

(1) According to an aspect of the present invention, there is provided a secondary battery management device, which is communicably connected to a secondary battery unit including a secondary battery and which manages the secondary battery unit, wherein the secondary battery management device is configured to: request the secondary battery unit to transmit a voltage and a state value of the secondary battery; receive the voltage and the state value of the secondary battery transmitted from the secondary battery unit; calculate a value of correction of the state value on the basis of the voltage and the state value which have been received; and transmit the calculated value of correction to the secondary battery unit in order to apply the calculated value of correction.

(2) According to another aspect of the present invention, in the secondary battery management device according to the aspect (1), the secondary battery management device is configured to apply the value of correction to the secondary battery at a timing designated for the secondary battery.

(3) According to another aspect of the present invention, in the secondary battery management device according to the aspect (1) or (2), the secondary battery management device is configured to: receive the voltage and the state value from each of a plurality of secondary battery units; calculate the value of correction using an algorithm common to the plurality of secondary battery units; and apply the value of correction at a tuning designated for each of the plurality of secondary battery units.

(4) According to another aspect of the present invention, in the secondary battery management device according to any one of the aspects (1) to (3), the secondary battery includes a plurality of cells, and the secondary battery management device is configured to: receive the voltage and the state value of each of the plurality of cells; calculate the value of correction of each of the plurality of cells on the basis of the voltage and the state value that have been received; transmit the calculated value of correction to the secondary battery unit; and instruct the secondary battery unit to perform discharging control for each cell.

(5) According to another aspect of the present invention, in the secondary battery management device according to any one of the aspects (1) to (4), the state value includes at least one of a charging rate, a remaining capacity, a maximum capacity, or a degree of deterioration of the secondary battery.

(6) According to another aspect of the present invention, in the secondary battery management device according to the aspect (1), a relationship between the voltage and the state value of the secondary battery has predetermined characteristics, and the secondary battery management device is configured to calculate the value of correction of the state value using a feature point or a feature section in the predetermined characteristics.

(7) According to another aspect of the present invention, in the secondary battery management device according to the aspect (4), the state value is a remaining capacity of the secondary battery, and the secondary battery management device is configured to: compare remaining capacities between the plurality of cells; and control discharging times of some cells having the remaining capacities which are relatively high.

(8) According to another aspect of the present invention, there is provided a secondary battery management method performed by a secondary battery management device, which is communicably connected to a secondary battery unit including a secondary battery and which manages the secondary battery unit, the secondary battery management method including: requesting the secondary battery unit to transmit a voltage and a state value of the secondary battery; receiving the voltage and the state value of the secondary battery transmitted from the secondary battery unit; calculating a value of correction of the state value on the basis of the voltage and the state value which have been received; and transmitting the calculated value of correction to the secondary battery unit in order to apply the calculated value of correction.

(9) According to another aspect of the present invention, the secondary battery management method according to the aspect (8) further includes: applying the value of correction to the secondary battery at a timing designated for the secondary battery.

(10) According to another aspect of the present invention, the secondary battery management method according to the aspect (8) or (9) further includes: receiving the voltage and the state value from each of a plurality of secondary battery units; calculating the value of correction using an algorithm common to the plurality of secondary battery units; and applying the value of correction at a timing designated for each of the plurality of secondary battery units.

(11) According to another aspect of the present invention, in the secondary battery management method according to any one of the aspects (8) to (10), the secondary battery includes a plurality of cells, and the secondary battery management method further includes: receiving the voltage and the state value of each of the plurality of cells; calculating the value of correction of each of the plurality of cells on the basis of the voltage and the state value that have been received; transmitting the calculated value of correction to the secondary battery unit; and instructing the secondary battery unit to perform discharging control for each cell.

(12) According to another aspect of the present invention, in the secondary battery management method according to any one of the aspects (8) to (11), the state value includes at least one of a charging rate, a remaining capacity, a maximum capacity, or a degree of deterioration of the secondary battery.

(13) According to another aspect of the present invention, in the secondary battery management method according to the aspect (8), a relationship between the voltage and the state value of the secondary battery has predetermined characteristics, and the secondary battery management method further includes: calculating the value of correction of the state value using a feature point or a feature section in the predetermined characteristics.

(14) According to another aspect of the present invention, in the secondary battery management method according to the aspect (11), the state value is a remaining capacity of the secondary battery, and the secondary battery management method further includes: comparing remaining capacities between the plurality of cells; and controlling discharging times of some cells having the remaining capacities which are relatively high.

(15) According to another aspect of the present invention, there is provided a non-transitory computer readable storage medium storing a program executed by a secondary battery management device, which is communicably connected to a secondary battery unit including a secondary battery and which manages the secondary battery unit, the program instructing the secondary battery management device to: request the secondary battery unit to transmit a voltage and a state value of the secondary battery; receive the voltage and the state value of the secondary battery transmitted from the secondary battery unit; calculate a value of correction of the state value on the basis of the voltage and the state value which have been received; and transmit the calculated value of correction to the secondary battery unit in order to apply the calculated value of correction.

(16) According to another aspect of the present invention, in the non-transitory computer readable storage medium according to the aspect (15), the program further instructs the secondary battery management device to: apply the value of correction to the secondary battery at a timing designated for the secondary battery.

(17) According to another aspect of the present invention, in the non-transitory computer readable storage medium according to the aspect (15) or (16), the program further instructs the secondary battery management device to: receive the voltage and the state value from each of a plurality of secondary battery units; calculate the value of correction using an algorithm common to the plurality of secondary battery units; and apply the value of correction at a timing designated for each of the plurality of secondary battery units.

(18) According to another aspect of the present invention, in the non-transitory computer readable storage medium according to any one of the aspects (15) to (17), the secondary battery includes a plurality of cells, and the program further instructs the secondary battery management device to: receive the voltage and the state value of each of the plurality of cells; calculate the value of correction of each of the plurality of cells on the basis of the voltage and the state value that have been received; transmit the calculated value of correction to the secondary battery unit; and instruct the secondary battery unit to perform discharging control for each cell.

(19) According to another aspect of the present invention, in the non-transitory computer readable storage medium according to any one of the aspects (15) to (18), the state value includes at least one of a charging rate, a remaining capacity, a maximum capacity, or a degree of deterioration of the secondary battery.

(20) According to another aspect of the present invention, in the non-transitory computer readable storage medium according to the aspect (15), a relationship between the voltage and the state value of the secondary battery has predetermined characteristics, and the program further instructs the secondary battery management device to: calculate the value of correction of the state value using a feature point or a feature section in the predetermined characteristics.

As used herein, the following directional terms "front, back, above, downward, right, left, vertical, horizontal, below, transverse, row and column" as well as any other similar directional terms refer to those instructions of a device equipped with the present invention. Accordingly, these terms, as utilized to describe the present invention should be interpreted relative to a device equipped with the present invention.

The term "configured" is used to describe a component, unit or part of a device includes hardware and/or software that is constructed and/or programmed to carry out the desired function.

Moreover, terms that are expressed as "means-plus function" in the claims should include any structure that can be utilized to carry out the function of that part of the present invention.

The term "unit" is used to describe a component, unit or part of a hardware and/or software that is constructed and/or programmed to carry out the desired function. Typical examples of the hardware may include, but are not limited to, a device and a circuit.

While preferred embodiments of the present invention have been described and illustrated above, it should be understood that these are examples of the present invention and are not to be considered as limiting. Additions, omissions, substitutions, and other modifications can be made without departing from the scope of the present invention. Accordingly, the present invention is not to be considered as being limited by the foregoing description, and is only limited by the scope of the claims.

What is claimed is:
1. A secondary battery management system comprising:
a secondary battery unit comprising a secondary battery; and
a secondary battery management device, which is communicably connected to the secondary battery unit and which manages the secondary battery unit,
wherein the secondary battery unit further comprises:
a measurer configured to measure an electric current value of the secondary battery;
an electric current value integrator configured to integrate electric current values measured by the measurer and calculate an integrated value of the electric current values for a predetermined period; and
a remaining capacity calculator configured to calculate a remaining capacity of the secondary battery on the basis of the integrated value calculated by the electric current value integrator, wherein the secondary battery management device is configured to:
request the secondary battery unit to transmit a voltage and the remaining capacity of the secondary battery;
receive the voltage and the remaining capacity of the secondary battery transmitted from the secondary battery unit;
calculate a value of correction of the remaining capacity on the basis of the voltage and the remaining capacity which have been received; and
transmit the calculated value of correction to the secondary battery unit, and
wherein the remaining capacity calculator is configured to correct the remaining capacity of the secondary battery on the basis of the value of correction transmitted from the secondary battery management device.

2. The secondary battery management system according to claim 1,
wherein the secondary battery management device is configured to apply the value of correction to the secondary battery at a timing designated for the secondary battery.

3. The secondary battery management system according to claim 1,
wherein the secondary battery management device is configured to:
receive the voltage and the remaining capacity from each of a plurality of secondary battery units;
calculate the value of correction using an algorithm common to the plurality of secondary battery units; and
apply the value of correction at a timing designated for each of the plurality of secondary battery units.

4. The secondary battery management system according to claim 1,
wherein the secondary battery comprises a plurality of cells, and
wherein the secondary battery management device is configured to:
receive the voltage and the remaining capacity of each of the plurality of cells;
calculate the value of correction of each of the plurality of cells on the basis of the voltage and the remaining capacity that have been received;
transmit the calculated value of correction to the secondary battery unit; and
instruct the secondary battery unit to perform discharging control for each cell.

5. The secondary battery management system according to claim 1,
wherein a relationship between the voltage and the remaining capacity of the secondary battery has predetermined characteristics, and
wherein the secondary battery management device is configured to calculate the value of correction of the remaining capacity using a feature point or a feature section in the predetermined characteristics.

6. The secondary battery management system according to claim 4,
wherein the remaining capacity is a remaining capacity of the secondary battery, and
wherein the secondary battery management device is configured to:
compare remaining capacities between the plurality of cells; and
control discharging times of some cells having the remaining capacities which are relatively high.

7. The secondary battery management system according to claim 1,
wherein the secondary battery management device is provided externally to the secondary battery unit.

8. The secondary battery management system according to claim 7,
wherein the measurer measures a voltage value of the secondary battery and outputs the measured electric current value and the measured voltage value to the electric current value integrator and the secondary battery management device.

9. The secondary battery management system according to claim 1,
wherein the secondary battery unit comprises a plurality of the secondary battery units including a first secondary battery unit and a second secondary battery unit,
wherein information representing a state of the secondary battery or a charging and discharging control management method is different between the first secondary battery unit and the second secondary battery unit.

10. A secondary battery management method performed by a secondary battery management system that comprises a secondary battery unit and a secondary battery management device, the secondary battery unit comprising a secondary battery, the secondary battery management device being communicably connected to the secondary battery unit and managing the secondary battery unit, the secondary battery management method comprising:
measuring, by a measurer of the secondary battery unit, an electric current value of the secondary battery;
integrating, by an electric current value integrator of the secondary battery unit, electric current values measured by the measurer;
calculating, by the electric current value integrator, an integrated value of the electric current values for a predetermined period;
calculating, by a remaining capacity calculator of the secondary battery unit, a remaining capacity of the secondary battery on the basis of the integrated value calculated by the electric current value integrator;
requesting, by the secondary battery management device, the secondary battery unit to transmit a voltage and the remaining capacity of the secondary battery;
receiving, by the secondary battery management device, the voltage and the remaining capacity of the secondary battery transmitted from the secondary battery unit;
calculating, by the secondary battery management device, a value of correction of the remaining capacity on the basis of the voltage and the remaining capacity which have been received;
transmitting, by the secondary battery management device, the calculated value of correction to the secondary battery unit; and
correcting, by the remaining capacity calculator, the remaining capacity of the secondary battery on the basis of the value of correction transmitted from the secondary battery management device.

11. The secondary battery management method according to claim 10, further comprising:
applying, by the secondary battery management device, the value of correction to the secondary battery at a timing designated for the secondary battery.

12. The secondary battery management method according to claim 10, further comprising:
receiving, by the secondary battery management device, the voltage and the remaining capacity from each of a plurality of secondary battery units;

calculating, by the secondary battery management device, the value of correction using an algorithm common to the plurality of secondary battery units; and applying, by the secondary battery management device, the value of correction at a timing designated for each of the plurality of secondary battery units.

13. The secondary battery management method according to claim 10, wherein the secondary battery comprises a plurality of cells, and wherein the secondary battery management method further comprises:

receiving, by the secondary battery management device, the voltage and the remaining capacity of each of the plurality of cells;

calculating, by the secondary battery management device, the value of correction of each of the plurality of cells on the basis of the voltage and the remaining capacity that have been received;

transmitting, by the secondary battery management device, the calculated value of correction to the secondary battery unit; and instructing, by the secondary battery management device, the secondary battery unit to perform discharging control for each cell.

14. The secondary battery management method according to claim 10, wherein a relationship between the voltage and the remaining capacity of the secondary battery has predetermined characteristics, and wherein the secondary battery management method further comprises:

calculating, by the secondary battery management device, the value of correction of the remaining capacity using a feature point or a feature section in the predetermined characteristics.

15. The secondary battery management method according to claim 13, wherein the remaining capacity is a remaining capacity of the secondary battery, and wherein the secondary battery management method further comprises:

comparing, by the secondary battery management device, remaining capacities between the plurality of cells; and controlling, by the secondary battery management device, discharging times of some cells having the remaining capacities which are relatively high.

* * * * *